(12) United States Patent
Yin et al.

(10) Patent No.: US 7,611,932 B2
(45) Date of Patent: Nov. 3, 2009

(54) METHOD OF MANUFACTURING A THIN FILM TRANSISTOR

(75) Inventors: Huaxiang Yin, Yongin-si (KR); Wenxu Xianyu, Yongin-si (KR); Takashi Noguchi, Seongnam-si (KR); Hans S. Cho, Seoul (KR); Ji-sim Jung, Incheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 330 days.

(21) Appl. No.: 11/199,272

(22) Filed: Aug. 9, 2005

(65) Prior Publication Data
US 2006/0084204 A1   Apr. 20, 2006

(30) Foreign Application Priority Data
Sep. 25, 2004   (KR) ............... 10-2004-0077615

(51) Int. Cl.
   *H01L 21/84*   (2006.01)
(52) U.S. Cl. .............. 438/166; 257/E21.561
(58) Field of Classification Search ......... 438/151–166; 257/E21.561
   See application file for complete search history.

(56) References Cited

U.S. PATENT DOCUMENTS

| | | | | |
|---|---|---|---|---|
| 4,054,895 A | * | 10/1977 | Ham | 257/354 |
| 4,199,773 A | * | 4/1980 | Goodman et al. | 257/351 |
| 4,232,327 A | * | 11/1980 | Hsu | 257/353 |
| 4,514,895 A | | 5/1985 | Nishimura | |
| 5,817,550 A | * | 10/1998 | Carey et al. | 438/166 |
| 6,413,802 B1 | | 7/2002 | Hu et al. | |
| 6,475,872 B1 | | 11/2002 | Jung | |
| 6,693,299 B1 | | 2/2004 | Yamazaki et al. | |
| 6,706,573 B2 | | 3/2004 | So | |
| 6,815,267 B2 | * | 11/2004 | So | 438/149 |
| 2004/0004222 A1 | | 1/2004 | Ahn | |

FOREIGN PATENT DOCUMENTS

| | | |
|---|---|---|
| CN | 1 431 718 A | 7/2003 |
| JP | 11-040815 | 2/1999 |
| KR | 10-2002-0078119 | 10/2002 |

* cited by examiner

*Primary Examiner*—Richard A. Booth
(74) *Attorney, Agent, or Firm*—Lee & Morse, P.C.

(57) ABSTRACT

A method of manufacturing a thin film transistor is provided. The method includes forming an amorphous silicon layer on a substrate, forming a source region, a drain region, and a region of a plurality of channels electrically interposed between the source region and the drain region by patterning the amorphous silicon layer, annealing a region of the channels, sequentially forming a gate oxide film and a gate electrode on a channel surface, and doping the source region and the drain region.

16 Claims, 6 Drawing Sheets

METHOD OF MANUFACTURING A THIN FILM TRANSISTOR

BACKGROUND OF THE INVENTION

1. Field of the Invention

The present invention relates to a method of manufacturing a thin film transistor. More particularly, the present invention relates to a method of manufacturing a thin film transistor having a low threshold voltage and a low leakage current.

2. Description of the Related Art

Generally, a thin film transistor (TFT) includes a channel, a source region and drain region formed on opposite sides of the channel, and a gate formed on the channel.

The channel may be an n-type channel or a p-type channel, according to the dopant doped in the source/drain region. For example, in the case of a p-type channel, the dopant may be boron (B), and in the case of an n-type channel, the dopant may be phosphorus (P) or arsenic (As).

A conventional TFT has a structure in which a short channel is formed between the source and drain regions. Recently, a fin field effect transistor (FinFET) structure having multiple channels between the source and drain regions has been proposed. The FinFET may have a structure in which the source and drain regions are connected by silicon having both a relatively large thickness and a relatively narrow width, i.e. having a high aspect ratio of silicon thickness to width. This type of FinFET may have superior electrical characteristics, such as high electron mobility, a low threshold voltage, a low subthreshold swing and a low leakage current.

Conventionally, the manufacture of a TFT having a FinFET structure (FinFET structure TFT) requires that a thin film process be performed on a silicon on insulator (SOI) substrate. This is because the material for forming the channel must be a single crystal silicon layer in order to increase the electron mobility through the channel. That is, if a single crystal silicon layer is not used for forming a channel having a relatively narrow width, the electrical characteristics of the channel may be reduced, and the driving voltage and threshold voltage may be increased.

The SOI substrate typically has a structure in which a silicon single crystal is formed on an insulating film. Typically, the manufacturing cost of devices built on the SOI substrate is high, since the SOI substrate is expensive. Furthermore, the thickness of the silicon single crystal is typically much smaller than the width of the channel, and thus it is difficult to produce a channel having a high aspect ratio of thickness to width.

Therefore, there is a need for a method of manufacturing a thin film TFT having improved electrical characteristics and having an improved ratio of silicon thickness to width, without using a single crystal silicon layer.

SUMMARY OF THE INVENTION

The present invention is therefore directed to a method of manufacturing a thin film transistor, which substantially overcomes one or more of the problems due to the limitations and disadvantages of the related art.

It is therefore a feature of an embodiment of the present invention to provide a thin film transistor having a plurality of channel regions formed between a source region and a drain region, wherein the channel regions are formed of polysilicon and subsequently treated to introduce crystallinity.

It is therefore another feature of an embodiment of the present invention to provide a thin film transistor formed from a polysilicon layer on an insulating substrate.

At least one of the above and other features and advantages of the present invention may be realized by providing a method of manufacturing a thin film transistor including forming an amorphous silicon layer on a substrate, patterning the amorphous silicon layer to form an amorphous silicon pattern, the pattern including a plurality of channels, a source region, and a drain region, wherein the plurality of channels is interposed between the source region and the drain region, annealing the plurality of channels, sequentially forming a gate oxide film and a gate electrode on the plurality of channels, and doping the source region and the drain region.

Annealing may include annealing with a laser beam, e.g., with a laser beam having an energy density that ranges from about 200 to about 2000 mJ/cm$^2$. The energy density of the laser beam may be about 800 mJ/cm$^2$. The method may further include annealing the source region and the drain region with the laser beam and may include doping a portion of the plurality of channels. The amorphous silicon layer may be formed to a thickness ranging from about 1 to about 1000 nm. Each of the plurality of channels may have a width ranging from about 1 to about 5000 nm. Each of the plurality of channels may have a ratio of thickness to width ranging from about 0.0002 to about 1000. Each of the plurality of channels may have a ratio of thickness to width ranging from about 0.1 to about 10. The source region and the drain region may be spaced apart by a distance ranging from about 10 to about 10000 nm. The substrate may be a glass substrate or a plastic substrate and the substrate may include a buffer layer formed of SiO$_2$ or SiN.

At least one of the above and other features and advantages of the present invention may also be realized by providing a method of forming a thin film transistor including providing a substrate having an insulating layer formed thereon, forming a polysilicon layer directly on the insulating layer, removing portions of the polysilicon layer to leave a polysilicon pattern on the insulating layer, wherein the polysilicon pattern includes a source structure, a drain structure, and at least two channel structures between the source structure and the drain structure, and crystallizing a portion of each of the at least two channel structures.

Crystallizing a portion of each of the at least two channel structures may include using a laser to irradiate a middle region of each of the at least two channel structures, without irradiating the source structure or the drain structure. Crystallizing a portion of each of the at least two channel structures may also include using a laser to irradiate the source structure, the drain structure, and all of each of the at least two channel structures.

At least one of the above and other features and advantages of the present invention may further be realized by providing a method of forming a FinFET transistor including forming a polysilicon fin on an insulating substrate, wherein the polysilicon fin extends vertically above the insulating substrate, and wherein a height of the polysilicon fin is greater than a width of the polysilicon fin, crystallizing a middle portion of the polysilicon fin, and forming a gate element over the crystallized middle portion.

The method may include crystallizing a middle portion of the polysilicon fin by heating the middle portion using a laser. The method may also include doping an uncrystallized portion of the polysilicon fin. Doping an uncrystallized middle portion of the polysilicon fin may include using the gate element as a mask to cover the crystallized middle portion and doping a portion of the polysilicon film that is not covered by the gate element.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
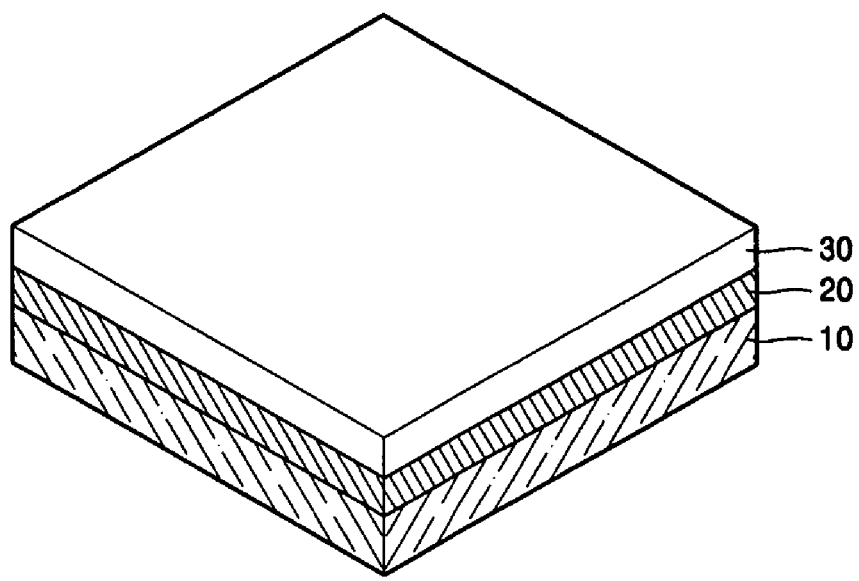
FIGS. 1A through 1G illustrate perspective views of stages in a method of manufacturing a thin film transistor, according to an embodiment of the present invention.

Korean Patent Application No. 10-2004-0077615, filed on Sep. 25, 2004, in the Korean Intellectual Property Office, and entitled: "Method of Manufacturing Thin Film Transistor," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A through 1G illustrate perspective views of stages in a method of manufacturing a thin film transistor, according to an embodiment of the present invention.

Referring to FIG. 1A, a buffer layer 20 may be formed on a substrate 10, e.g., a glass substrate, and an amorphous silicon layer 30 may be formed on the buffer layer 20. The amorphous silicon layer 30 may be formed to a thickness ranging from about 1 to 1000 nm.

By interposing the buffer layer 20 between the amorphous silicon layer 30 and the glass substrate 10, improved interface characteristics and improved adhesiveness between the amorphous silicon layer 30 and the glass substrate 10 may be obtained. The buffer layer 20 may also act as an insulating layer on the glass substrate 10. The buffer layer 20 may include $SiO_2$, SiN or other materials. The buffer layer 20 and the amorphous silicon layer 30 may be formed by Plasma Enhanced Chemical Vapor Deposition (PECVD), Low Pressure Chemical Vapor Deposition (LPCVD), sputtering deposition, ion beam, etc.

Figure 1B:
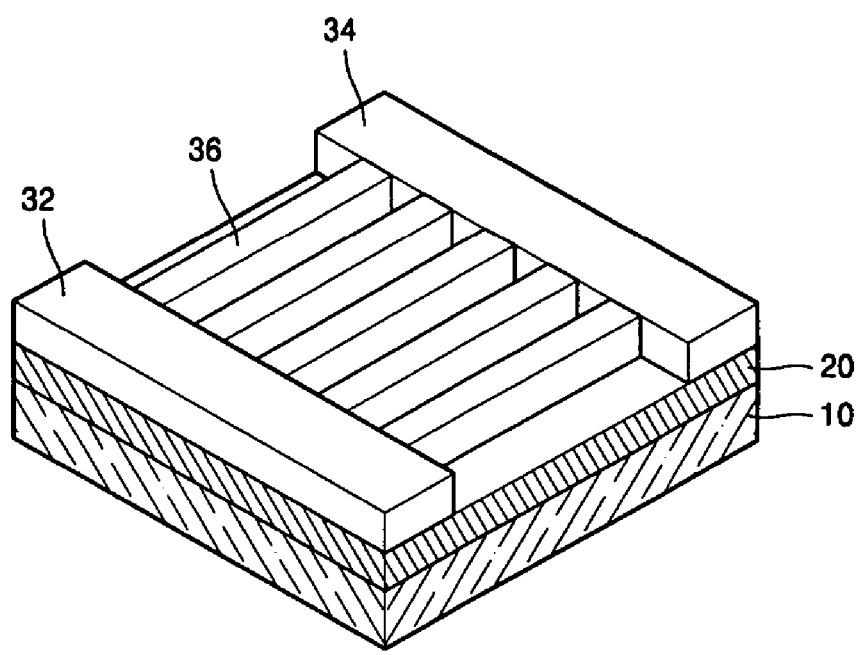

Referring to FIG. 1B, a source region 32, a drain region 34 and a channel region 36 may be formed on the buffer layer 20, e.g., by patterning the amorphous silicon layer 30. The amorphous silicon layer 30 may be patterned in a predetermined shape, such that a plurality of channel regions is electrically interposed between the source region 32 and the drain region 34. The source region 32 and the drain region 34 may be spaced apart by a distance ranging from about 10 to about 10000 nm. The channels 36 may be formed in a striped pattern between the source region 32 and the drain region 34. Each channel region 36 may have a width ranging from about 1 to about 5000 nm.

Figure 1C:
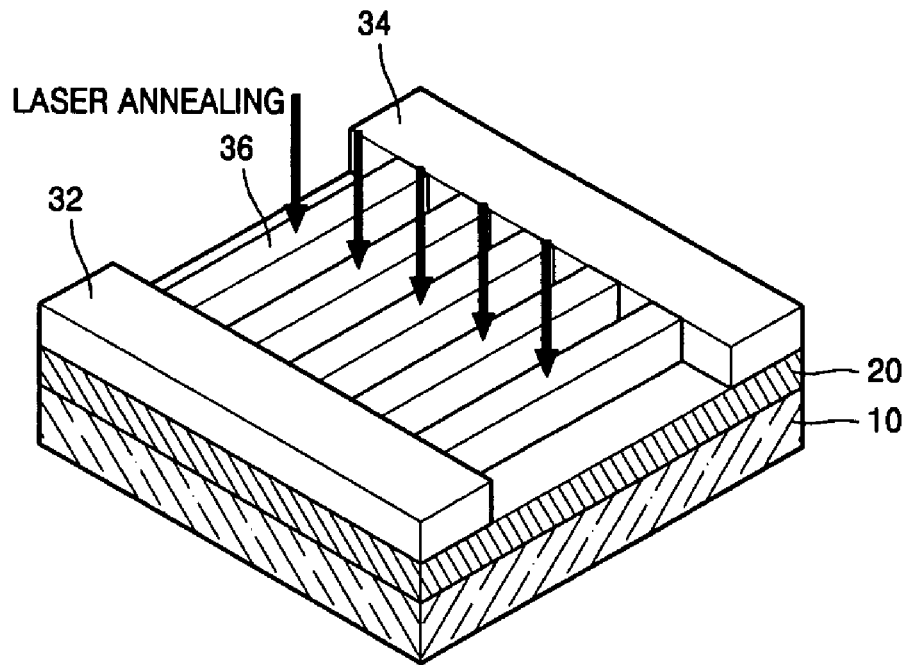

Referring to FIG. 1C, the channel regions 36 may be treated to crystallize the channels. Crystallization may be complete, or partial. Treatment may include annealing, e.g., by a laser beam. The energy density of the laser beam may be in the range of from about 200 to about 2000 mJ/cm$^2$. The source 32 and the drain 34 regions may also be treated.

Figure 1D:
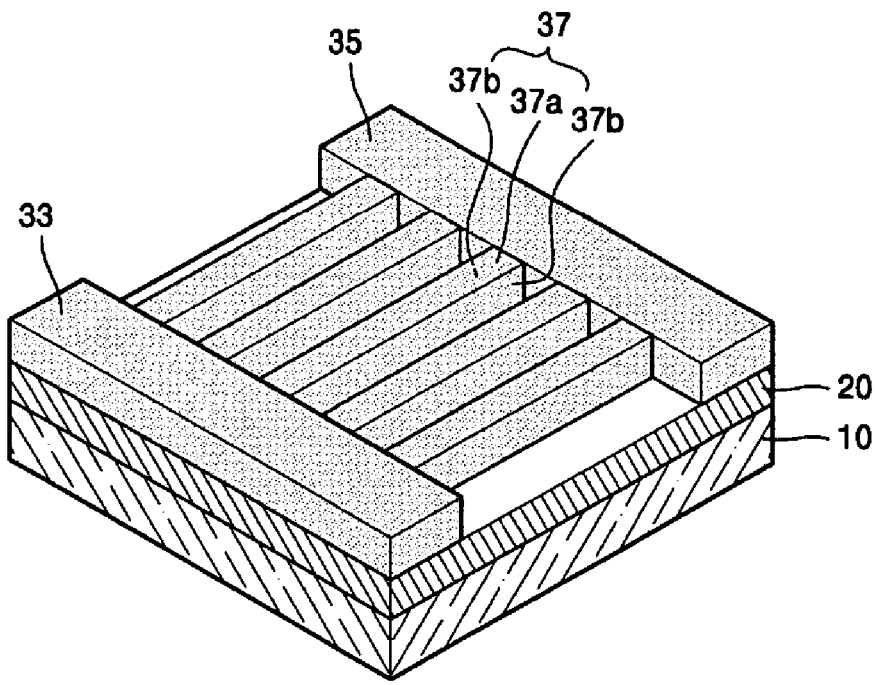

FIG. 1D illustrates crystallized channels 37, a source region 33 and a drain region 35, after treatment by annealing. Heat absorbed by the relatively narrow channels 37 during annealing may be easily radiated to the outside. Due to the geometrical structure of the channels 37, the source region 33 and the drain region 35, the heat of annealing may affect the channels 37 to a greater extent that it affects the source region 33 and the drain region 35. The mechanics of the laser annealing effect may be explained as follows, although it is noted that the scope of the present invention is not limited by this description. In detail, during laser annealing, heat distributed across the melted silicon surfaces of channels 37, source 33 and drain 35 may rapidly dissipate. The heat dissipation may result in temperature gradients from the channels 37, source 33 and drain 35 to the surrounding atmosphere, and from the channels 37 to the source 33 and drain 35. Further, the temperature gradients from the channels 37 to the surrounding atmosphere may be greater than the gradients from the source 33 and drain 35 to the surrounding atmosphere, due to the relatively large surfaces of the channels 37. Overall, these temperature gradients may promote improved grain structures in the channels 37. Thus, the grain size of the channels 37 may be more affected when annealed by a laser beam, relative to the grain size of the source region 33 and drain region 35. Thus, annealing may develop improved crystalline structures having larger grain sizes, which may be arranged more tightly and have a smoother surface, in the channels 37. This may be advantageous because the improved crystalline structures may exhibit fewer defects at the grain boundaries, thereby improving electron mobility. Therefore, the channels 37 may have high electron mobility. In contrast, heat absorbed by the source region 33 and the drain region 35 during annealing may have a lesser effect, e.g., because it may be more easily radiated, relative to the channels 37. Thus, the source region 33 and the drain region 35 may have a crystal texture that has a relatively smaller grain size, as compared to the channels 37.

During treatment, e.g., laser irradiation, and crystallization of the striped silicon channel pattern, the thickness of the crystallized channels 37 may be increased significantly, and the width decreased significantly, as compared to the original (unannealed) channel regions 36. Thus, annealing may produce structures having a high ratio of silicon thickness to width. The mechanics of this may be explained as follows, although it is noted that the scope of the present invention is not limited by this description. It is noted that the relative changes in channel height and width may depend on many parameters, including, e.g., laser annealing energy, the thickness of the original amorphous silicon layer 30, the width of the original channels 37, the type of substrate 10, the presence and/or nature of the buffer layer 20, etc. In detail, channels 37 have three sides (an upper surface 37a and both side surfaces 37b), and the upper surface 37a may have the same size as the side surfaces 37b. Laser annealing may result in an increase of channel height ranging from about 0% to 500% and may result in a decrease of channel width ranging from about 0% to about 90%. For example, a channel annealed with an energy of about 800 mJ/cm$^2$, having an original thickness of about 100 nm and an original width of about 1200 nm, i.e., a height to width ratio of about 0.083, may exhibit an annealed thickness of about 350 nm and a decreased width of about 450 nm, i.e., a ratio of about 0.78.

Figure 1E:
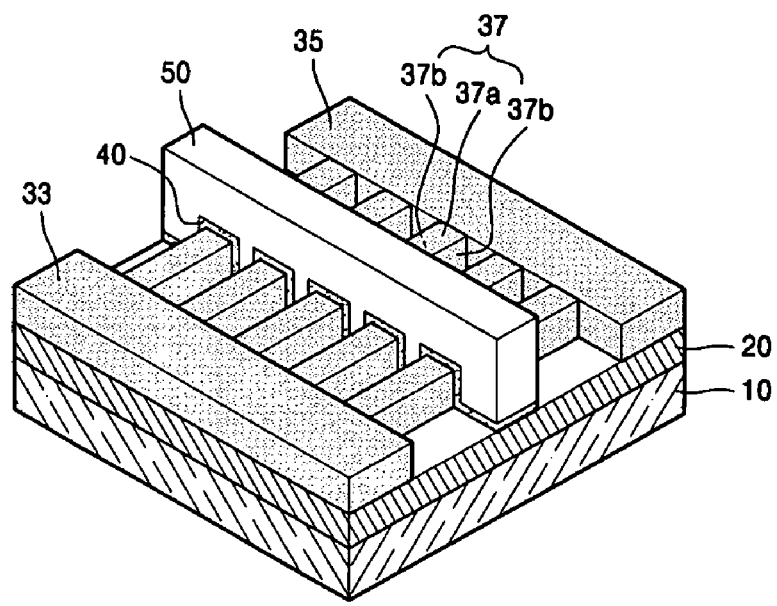

Referring to FIG. 1E, a gate may be formed on the crystallized channels 37. The gate may include, e.g., an oxide film 40 and a gate electrode 50, which may be sequentially formed on the upper surface 37a and both side surfaces 37b of the crystallized channel 37. A gate electrode structure of this nature may supply a relatively strong electrical control effect on the channels. Thus, a low threshold voltage, a low subthreshold swing and a low leakage current of the resulting TFT may be achieved.

The gate oxide film 40 and the gate electrode 50 may be formed by a variety of processes, e.g., Inductively Coupled Plasma Chemical Vapor Deposition (ICPCVD), PECVD or LPCVD. The gate oxide film 40 and the gate electrode 50 may be formed in a predetermined pattern on a selected portion of the channels 37, e.g., on an upper surface 37a and both side surfaces 37b of the channels 37. The gate oxide film 40 and the gate electrode 50 may be patterned, e.g., by an etching process.

The gate oxide film 40 may be formed of an insulating material, e.g., SiO$_2$, and may have a thickness ranging from about 1 to about 300 nm.

The gate electrode 50 may be formed of Cr, Al, MoW or polysilicon, and may have a thickness ranging from about 1 to about 1000 nm.

In an embodiment of the present invention, the gate oxide film 40 and the gate electrode 50 may be formed on a portion of the channels 37, while in another embodiment of the present invention, the gate oxide film 40 and the gate electrode 50 may be formed on an entire surface of the channels 37.

Figure 1F:
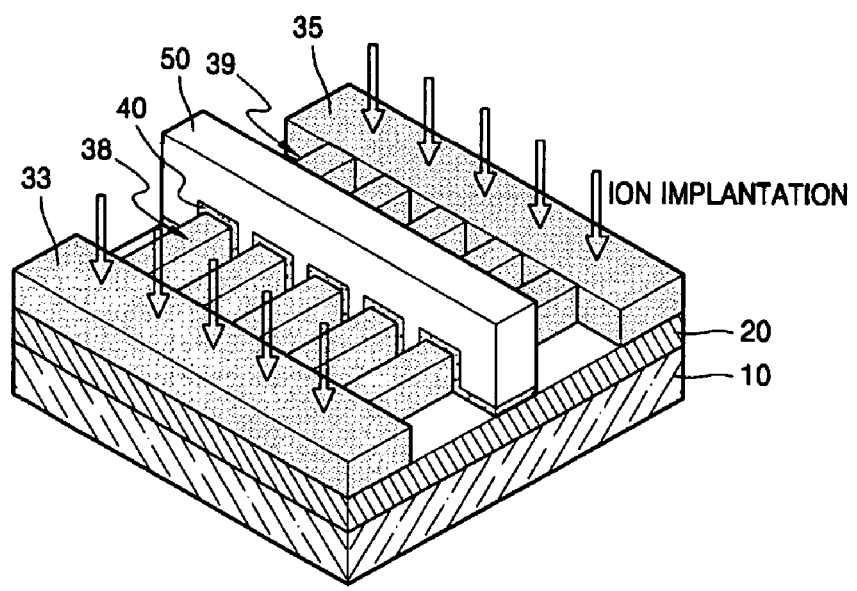
Figure 1G:
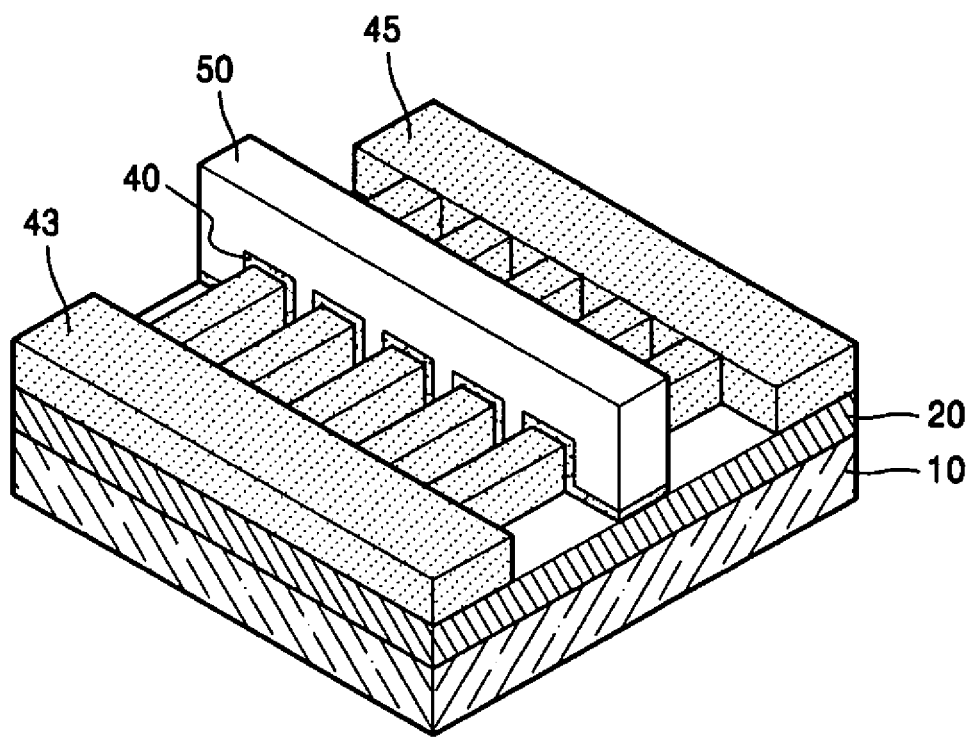

Referring to FIGS. 1F and 1G, a predetermined dopant may be doped in the source region 33 and the drain region 35. The dopant may be at least one dopant selected from the group consisting of B, P, and As. Each of the source region 33 and the drain region 35 may include from about $1\times10^{19}$ to about $1\times10^{22}$ atoms/cm$^3$ of dopant. Doping may be performed by, e.g., an ion implementation method, an ion showering method or a plasma doping method.

If the gate oxide film 40 and the gate electrode 50 are formed only on a portion of the surface of the channels 37, the dopant may also be doped on regions 38 and 39 of the channels 37 (i.e., regions on which the gate oxide film 40 and the gate electrode 50 are not formed).

After doping the ion element, the source region 33 and the drain region 35 may be annealed to yield annealed doped source and drain regions 43 and 45, e.g., by activating the doped region using a low temperature furnace or a laser beam.

Figure 2:
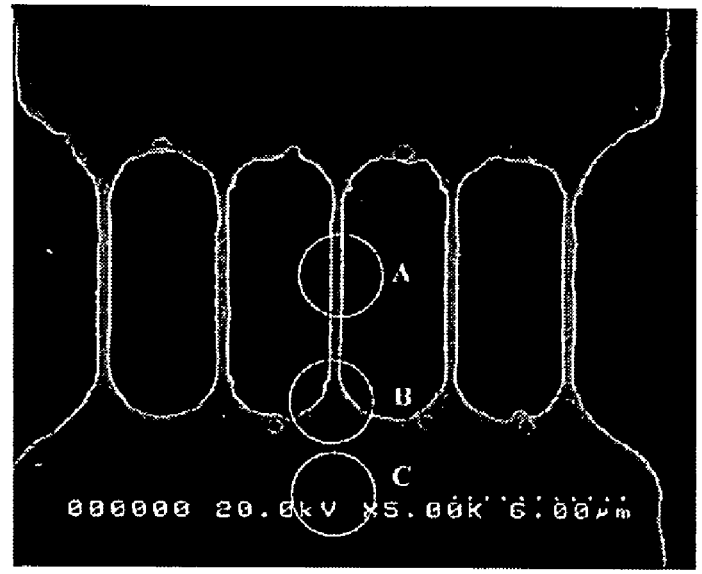
FIG. 2 illustrates a scanning electron microscope image of a channel region crystallized by laser annealing, using an energy density of about 800 mJ/cm$^2$.
Figure 3:
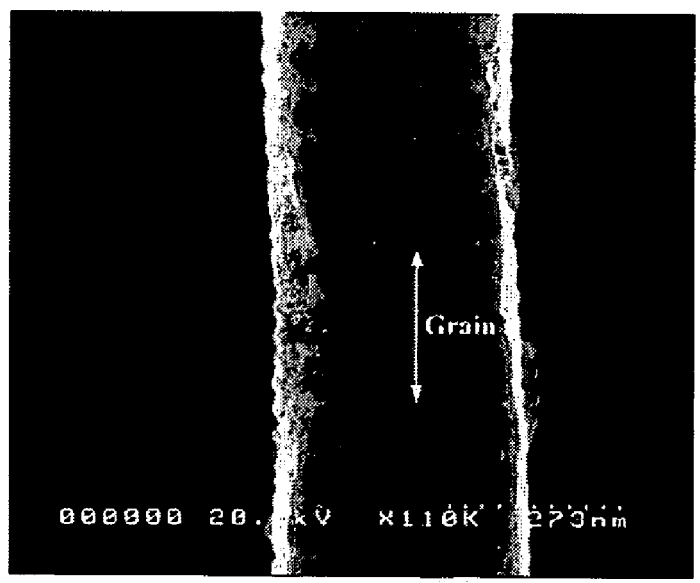
FIG. 3 illustrates a magnified portion of region A in FIG. 2.
Figure 4:
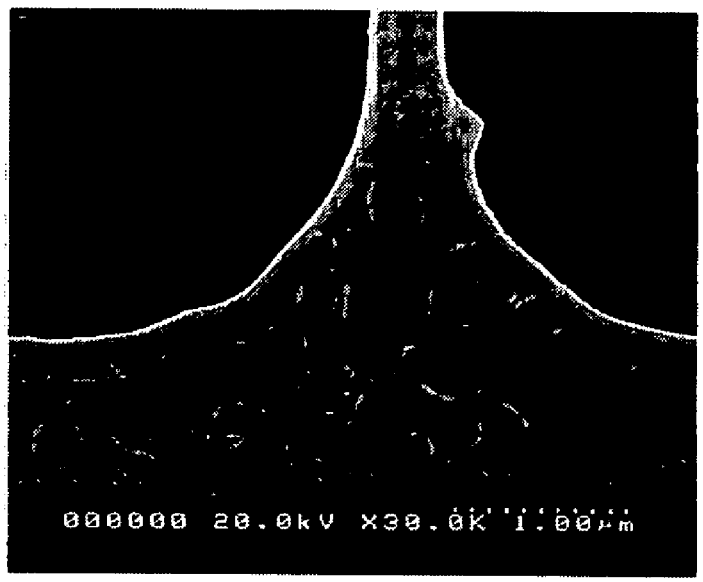
FIG. 4 illustrates a magnified portion of region B in FIG. 2.
Figure 5:
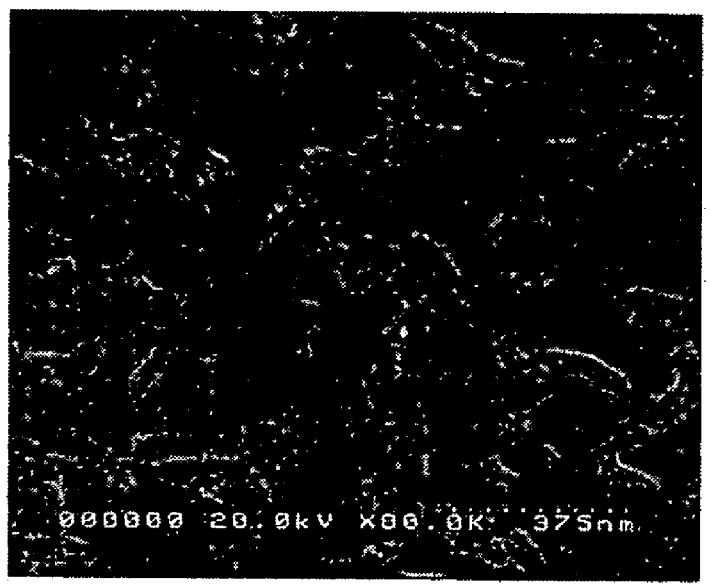
FIG. 5 illustrates a magnified portion of region C in FIG. 2.

FIG. 2 illustrates a scanning electron microscope image of a channel region crystallized by laser annealing, using an energy density of about 800 mJ/cm$^2$. FIGS. 3 through 5 illustrate magnified portions of the regions A, B and C in FIG. 2, respectively.

Large size grains, more tightly arranged and exhibiting a smoother surface, may be obtained in the channel regions, as illustrated in FIG. 3. Less grain texture may be obtained in the connection region between the channels and the source/drain regions, while amorphous and crystalline material may both exist in the source/drain regions, as illustrated in FIGS. 4 and 5.

Manufacturing a TFT according to the present invention may provide multiple advantages. A TFT having high electron mobility, a low threshold voltage, a low leakage current, and a low driving voltage may be manufactured. A TFT having a relatively high switching characteristic may be manufactured since the gate electrode controls each of the multiple channels. A TFT having a multiple channels may be manufactured using an amorphous silicon layer formed on a substrate, e.g., a glass substrate, without using a conventional single crystal silicon layer of an expensive SOI substrate. Superior device characteristics resulting from multiple channels may be obtained and manufacturing costs may be reduced.

Manufacturing a TFT according to the present invention may be implemented for a variety of devices, e.g., Active Matrix Liquid Crystal Displays (AMLCD), semiconductor memory devices, devices that use a plastic substrate, electronic devices in which a TFT is used as a switching device or amplifying devices generally.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a thin film transistor, comprising:
    forming an amorphous silicon layer on a substrate;
    patterning the amorphous silicon layer to form a monolithic amorphous silicon pattern, the patterning including:
        forming a plurality of amorphous channels each having first ends and second ends,
        forming an amorphous source region integral with the first ends of each of the amorphous channels, and
        forming an amorphous drain region integral with the second ends of each of the amorphous channels, such that the monolithic amorphous silicon pattern includes the plurality of amorphous channels interposed between the source region and the drain region;
    after patterning the amorphous silicon layer, applying a laser beam to the plurality of amorphous channels thereby converting the plurality of amorphous channels to a crystalline state;
    sequentially forming a gate oxide film and a gate electrode on the plurality of crystallized channels; and
    doping the source region and the drain region.

2. The method of claim 1, wherein an energy density of the laser beam ranges from about 200 to about 2000 mJ/cm$^2$.

3. The method of claim 2, wherein the energy density of the laser beam is about 800 mJ/cm$^2$.

4. The method of claim 1, further comprising, while converting the plurality of amorphous channels to a crystalline state, applying the laser beam to the source and drain regions thereby converting the source region and the drain region to a crystalline state.

5. The method of claim 1, wherein the gate electrode exposes portions of the channels along first and second sides of the gate electrode, the method further including doping a portion of the plurality of channels using the gate electrode as a mask.

6. The method of claim 1, wherein the amorphous silicon layer is formed to a thickness ranging from about 1 to about 1000 nm.

7. The method of claim 1, wherein each of the plurality of channels has a width ranging from about 1 to about 5000 nm.

8. The method of claim 1, wherein each of the plurality of channels has a ratio of thickness to width ranging from about 0.0002 to about 1000.

9. The method of claim 8, wherein each of the plurality of channels has a ratio of thickness to width ranging from about 0.1 to about 10.

10. The method of claim 1, wherein the source region and the drain region are spaced apart by a distance ranging from about 10 to about 10000 nm.

11. The method of claim 1, wherein the substrate is a glass substrate.

12. The method of claim 1, wherein the substrate is a plastic substrate, and the amorphous silicon layer is formed directly on the plastic substrate.

13. The method of claim 1, wherein the substrate includes a buffer layer, the buffer layer formed of $SiO_2$ or SiN.

14. The method as claimed in claim 1, wherein, in forming the monolithic amorphous silicon pattern, the amorphous source and drain regions are formed have thicknesses substantially equal to thicknesses of the amorphous channels, and the amorphous source and drain regions are formed to extend above the substrate by a distance substantially equal to that of the amorphous channels.

15. The method as claimed in claim 1, wherein the amorphous channels are formed to contact the substrate along the entire length of the channels, and the amorphous channels are in contact with the substrate along the entire length thereof while the laser beam is applied thereto during crystallization.

16. The method as claimed in claim 4, wherein the crystallized channels are electrically connected to adjacent crystallized channels by respective crystallized portions of the source and drain regions.

* * * * *